United States Patent
Chen

(10) Patent No.: US 12,289,857 B1
(45) Date of Patent: Apr. 29, 2025

(54) BRACKET FOR OPEN RACK

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 18/608,947

(22) Filed: Mar. 19, 2024

(51) Int. Cl.
*H05K 7/14* (2006.01)

(52) U.S. Cl.
CPC .................. *H05K 7/1489* (2013.01)

(58) Field of Classification Search
CPC .... H05K 7/1489; H05K 7/1488; H05K 7/183; H02B 1/34; A47B 88/43; A47B 96/1408; F16B 12/10
See application file for complete search history.

(56) References Cited

U.S. PATENT DOCUMENTS

| | | | | |
|---|---|---|---|---|
| 6,021,909 | A * | 2/2000 | Tang | H05K 7/1421 211/183 |
| 6,431,668 | B1 * | 8/2002 | Reddicliffe | A47B 88/43 312/334.1 |
| 6,513,770 | B1 * | 2/2003 | Franz | G02B 6/4471 312/223.1 |
| 6,769,551 | B2 * | 8/2004 | Rafferty | H05K 7/1492 211/192 |
| 7,014,155 | B1 * | 3/2006 | Schnabel | A47B 96/063 312/265.5 |
| 8,262,041 | B2 * | 9/2012 | Bergesch | H05K 7/183 312/265.6 |
| 10,314,394 | B2 * | 6/2019 | Chen | H05K 7/183 |
| 11,576,277 | B2 * | 2/2023 | Chen | H05K 7/1489 |
| 11,647,836 | B2 * | 5/2023 | Chen | A47B 57/32 211/162 |
| 12,055,169 | B2 * | 8/2024 | Chen | H05K 7/1489 |
| 2014/0042114 | A1 * | 2/2014 | Chen | H05K 7/1489 211/183 |
| 2022/0087421 | A1 * | 3/2022 | Chen | H05K 7/183 |
| 2023/0029230 | A1 * | 1/2023 | Chen | F16B 12/10 |

FOREIGN PATENT DOCUMENTS

TW 532499 5/2003

* cited by examiner

*Primary Examiner* — Ko H Chan
(74) *Attorney, Agent, or Firm* — Fei-Hung Yang

(57) ABSTRACT

A bracket includes a main body, an elastic positioning and locking plate, a load-bearing part, and multiple reinforcement ribs. The front and rear sides of the main body are provided with a first hook and a second hook respectively. The first hook is provided with an operating hole, the elastic positioning and locking plate is connected to the operating hole and protruded with a locking part to form a locking, and provided with an operating part corresponding to the operating hole for a release purpose. The load-bearing part is integrally formed and bent from a lower edge of the main body to support a server chassis, and each reinforcement rib is integrally formed on the load-bearing part and the main body to reduce frictional resistance.

8 Claims, 4 Drawing Sheets

BRACKET FOR OPEN RACK

BACKGROUND OF THE DISCLOSURE

Technical Field

The present disclosure relates to the technical field of open racks, and more particularly relates to a bracket for drawer-type open racks, which greatly simplifies the structure and can be quickly installed in the open racks, so that a server chassis can be placed into the open rack or taken out from the open rack in a drawer-like operation, thus greatly improving the convenience of operation and the stability and security after installation.

Description of the Related Art

Due to the global trend of the decreasing server shipments in recent years, coupled with requirements such as net-zero carbon emissions and green transformation awareness, traditional sever cabinets have to improve their design flexibility and performance. Therefore, a new-generation Open Computing Project (OCP) standard was introduced, successfully reducing the loss of a large amount of current and conduction. As a result, open racks focusing on redesigning hardware technology for IT infrastructures has emerged and correspondingly generated a series of related server products in compliance with the open rack standard, not only supporting the new generation of x86 and ARM platform processors, but also offering the advantage of an open, scalable and high-performance design suitable for various application fields from small data centers to ultra-large deployments. The characteristic of open rack is that there is a rack vertically erected from four corners, and the surface of each rack is separated by a plurality of mounting holes, square holes, round holes or even screw holes, etc. In the past, for the convenience of maintenance and replacement, most of the racks are equipped with a pair of rails, which are mounted between the racks by length-adjustable brackets, and used to outwardly withdraw or inwardly push a server chassis in the horizontal direction like a drawer. However, the installation and removal of the pair of rails are time consuming and will incur a higher using cost of the open racks.

According to the standard of existing open computing projects, it is not necessary to fix the server chassis in the open rack, but it just needs to be connected to other servers and places them in the open rack. For example, R.O.C. Pat. No. 532499 entitled "Slot rod structure for server racks has disclosed a structure with one or more linearly arranged wings protruded outwardly from both sides of a housing of a server system. Each slot rod includes a frame and two positioning rods, wherein the frame has an n-shaped cross-section, a plate at the center has a plurality of rectangular through holes. The wings at the housing of the server system containing an electronic device are mounted to the top of the n-shaped frame in order to slide back and forth on the slot rod. This structural design for the existing open racks is not just difficult to use and the housing of this design cannot be used in other server cabinets only, but it also increases the cost and difficulty of production. Obviously, this design is not suitable for the needs of the current open computing projects, and there is a need to design and develop its own bracket for the open computing projects, in order to provide the convenience and stability of use.

In view of the aforementioned issues of the related art, the present discloser based on years of experience to conduct research and experiment, and developed a bracket for an open rack in compliance with the installation method of the server open racks in an economic and practical manner. The bracket is designed with an elastic positioning, a locking plate and a plurality of reinforcement ribs to realize a quick installation, greatly improve the installation stability, and achieve the effects of reducing the frictional resistance when withdrawing the server chassis and even enhance the load-bearing capacity of a load-bearing part, so as to improve the practical use significantly.

SUMMARY OF THE DISCLOSURE

It is a primary objective of the present disclosure to provide a bracket for an open rack, the bracket includes a main body, an elastic positioning and locking plate, a load-bearing part and a plurality of reinforcement ribs. The elastic positioning and locking plate is provided for locking the main body in the open rack, or performing a release function. Each reinforcement rib is integrally formed with the main body that is connected to a surface of the load-bearing part to reduce frictional resistance. Therefore, the present disclosure greatly simplifies the structure of the bracket, which can be installed in the open rack quickly, so that a server chassis can be put into the open rack or taken out from the open rack in a drawer-like operation, thus improving the convenience of operation and the stability and security after installation.

To achieve the aforementioned objective, the present disclosure provides a bracket for an open rack, wherein four corner inside the open rack are provided with a rack separately, each rack has a plurality of square holes provided for mounting a pair of the brackets between two of the racks across the same side of the open rack, such that a server chassis can be put into the open rack or taken out from the open rack in a drawer-like operation through the pair of brackets. Each bracket includes: a main body, with a first hook disposed on the front side of the main body and configured to be corresponsive to one of the racks, a second hook disposed on the rear side of the main body and configured to be corresponsive to another rack, the openings of the first hook and the second hook being horizontally configured, and a side of the first hook being provided with an operating hole; an elastic positioning and locking plate, connected into the operating hole, and including a locking part protruded from the elastic positioning and locking plate and configured to be corresponsive to the first hook, such that after the first hook is embedded into a square hole, the locking part is locked into another square hole that is lower to define a locking status, and the elastic positioning and locking plate including an operating part configured to be corresponsive to the operating hole and operated to separate the locking part from the other square hole to define a release status; a load-bearing part, integrally formed with and bent from a lower edge of the main body, configured to be perpendicular to the main body, and extended along the extension direction of the main body, for carrying the server chassis; and a plurality of reinforcement ribs, integrally formed with a position of the main body connected to the load-bearing part, protruded from the main body and a surface of the load-bearing part, and contacted with the server chassis to reduce the frictional resistance produced during the pulling of the server chassis In an embodiment of the present disclosure, the locking part is integrally formed with and bent from the elastic positioning and locking plate, and the locking part is a rectangular block structure protruding towards a surface of the rack. In addition, the locking part comprises a first corner and a second corner configured to be corresponsive to two corners of the other square hole respectively, the first corner is configured to be corresponsive to a corner position of the other square hole that the locking part enters into the other square hole, and the second corner is configured to be corresponsive to a corner position of the other square hole that the locking part snaps to the other square hole. the first corner has a curved round corner with a radius greater than the radius of a curved round corner of the second corner, such that the locking part is guided, installed and snapped securely into the other square hole when entering into the other square hole. It is noteworthy that the locking part has a width of 12.5 mm and a thickness of 2.5 mm in actual verifications.

In another embodiment of the present disclosure, the reinforcement ribs are non-equidistantly spaced from each other, and the height of the reinforcement ribs protruded from the main body and the surface of the load-bearing part falls within a range of 0.05~0.15 mm, and preferably 0.05 mm. In addition, the bracket is divided into three areas, respectively: a front section, a middle section and a rear section by the first hook and the second hook, and two of the reinforcement ribs are arranged in the front section, three of the reinforcement ribs are arranged in the middle section, and one of the reinforcement ribs is arranged in the rear section according to setting, and the reinforcement ribs in each area are uniformly distributed. It is noteworthy that each reinforcement rib has a width of 10 mm, and the plurality of reinforcement ribs that is arranged at the main body has a length of 30 mm, and the plurality of reinforcement ribs that is arranged at load-bearing part has a length of 15 mm.

DESCRIPTION OF THE PREFERRED EMBODIMENTS

To make it easier for the examiner to understand the content of the present disclosure, the specification accompanied by the drawings is described as follows.

Figure 1:
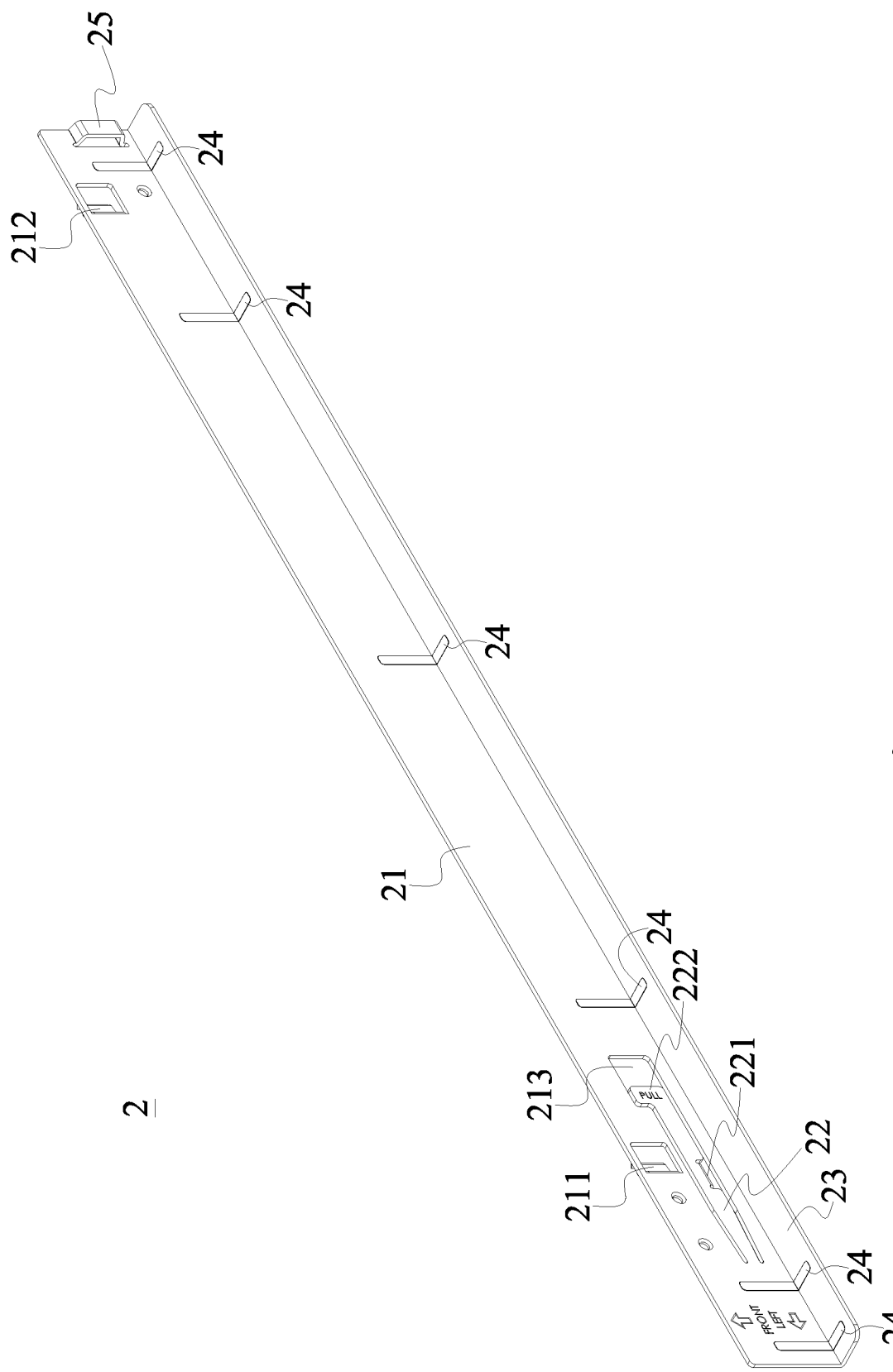
FIG. 1 is a schematic view showing the structure of a preferred embodiment of the present disclosure.
Figure 2:
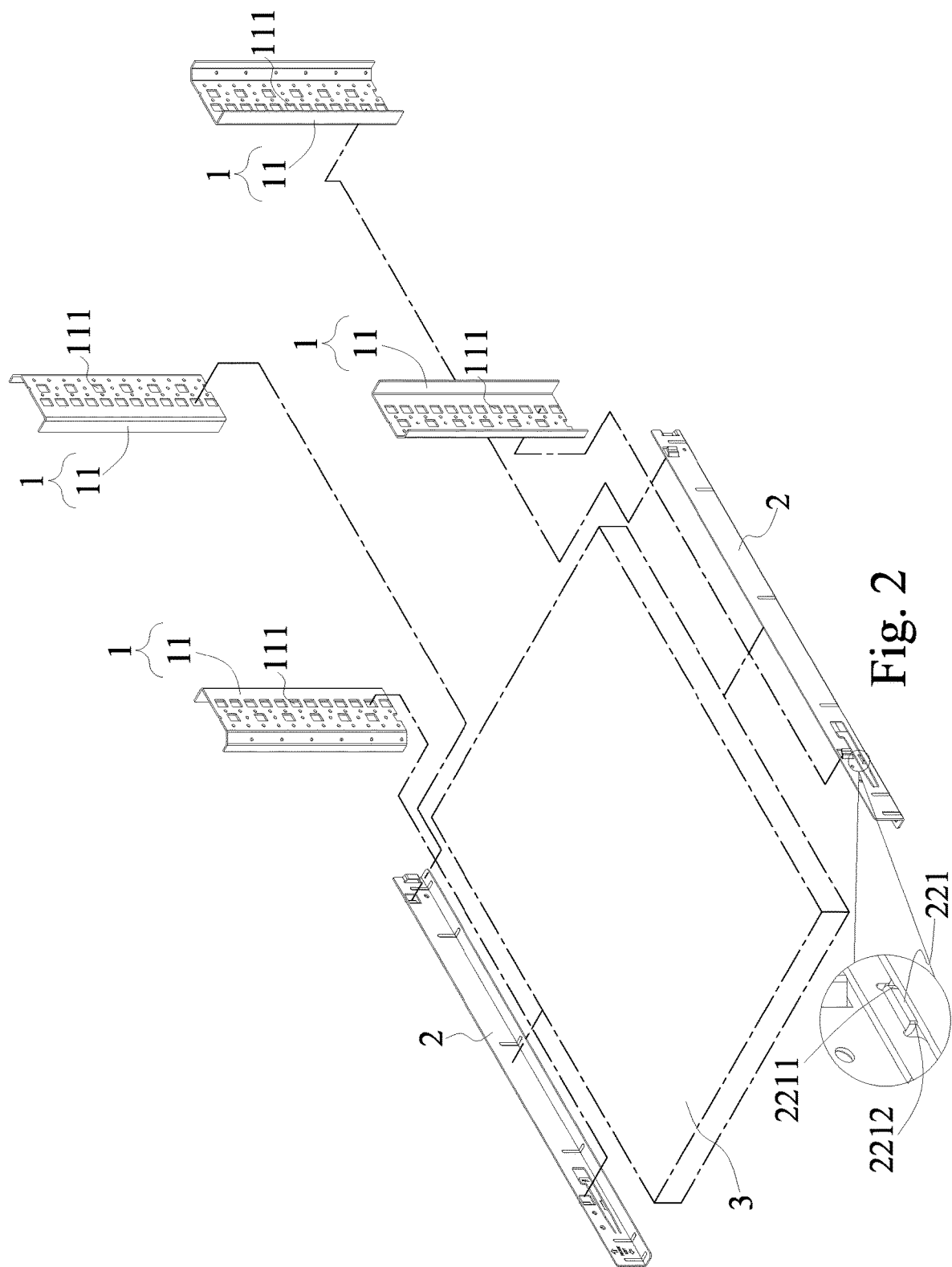
FIG. 2 is a schematic view showing the configuration of a preferred embodiment of the present disclosure during installation.
Figure 3:
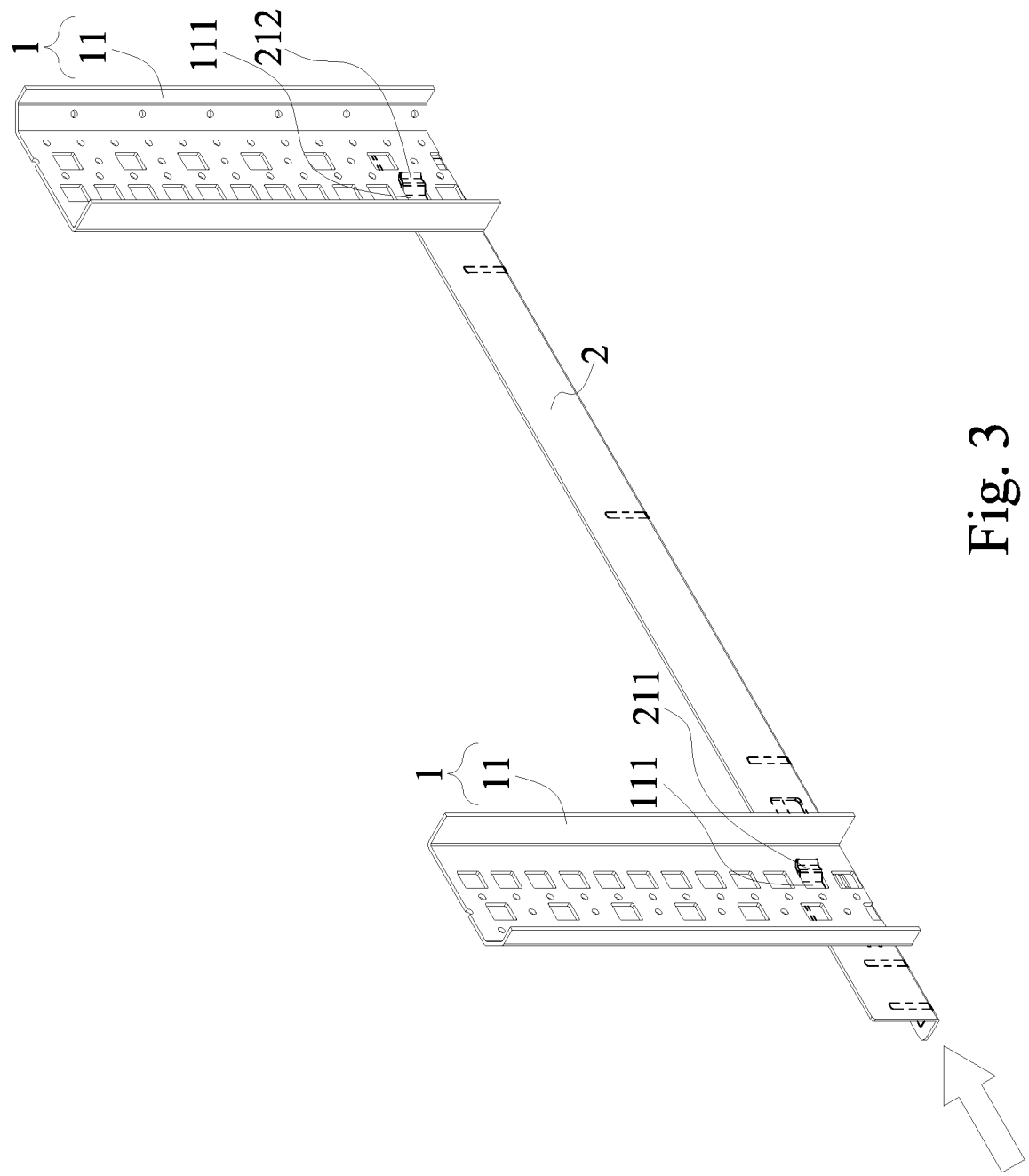
FIG. 3 is a first schematic view showing an operating status of a preferred embodiment of the present disclosure.
Figure 4:
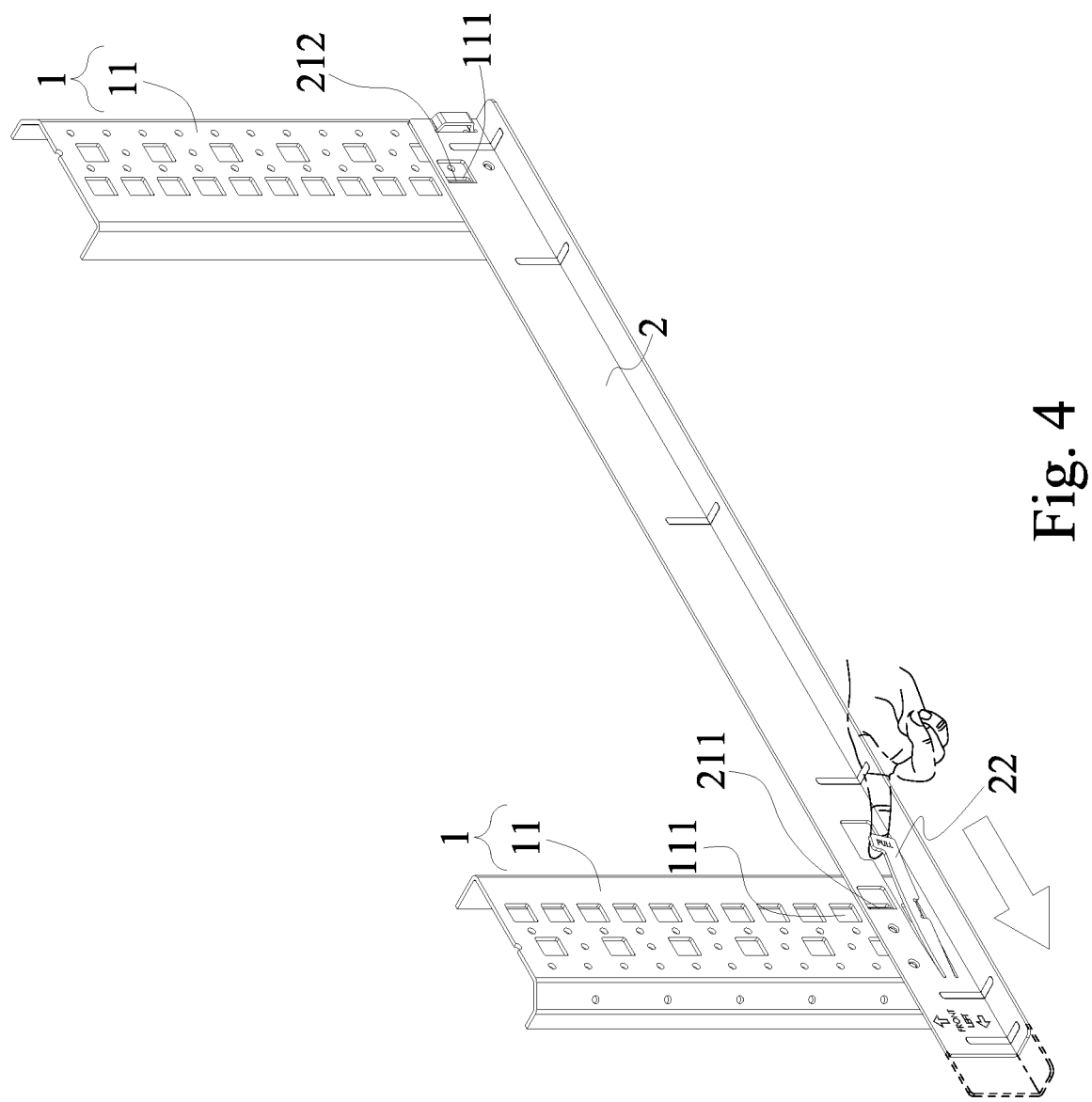
FIG. 4 is a second schematic view showing an operating status of a preferred embodiment of the present disclosure.

With reference to FIGS. 1, 2, and 3 and 4 for the schematic views showing the structure, the configuration during installation, and the two operating statuses of a preferred embodiment of the present disclosure respectively, the present disclosure discloses a bracket 2 of an open rack 1, wherein each of the four corners inside the open rack 1 is provided with a rack 11, each rack 11 has a plurality of square holes 111 for mounting a pair of the brackets 2 between the two racks 11 of the open rack 1 on the same side, such that a server chassis 3 can be put into the open rack 1 or taken out from the open rack 1 in a drawer-like operation through the pair of brackets 2, and each bracket 2 includes a main body 21, an elastic positioning and locking plate 22, a load-bearing part 23 and a plurality of reinforcement ribs 24.

The front side of the main body 21 is provided with a first hook 211 which is configured to be corresponsive to one of the rack 11, the rear side of the main body 21 is provided with a second hook 212 which is configured to be corresponsive to another rack 11, openings of the first hook 211 and the second hook 212 are horizontally configured, and adjacent a side of the first hook 211 is provided with an operating hole 213 in the main body 21.

The elastic positioning and locking plate 22 is connected into the operating hole 213, and provided with a locking part 221 which is protruded from the elastic positioning and locking plate 22. After the first hook 211 is embedded into one of the square holes 111, the locking part 221 is snapped into another square hole 111 that is lower to define a lock status. After an operating part 222 of the elastic positioning and locking plate 22 configured to be corresponsive to the operating hole 213 is operated, the locking part 221 can be separated from the other square hole 111 to define a release status. It is noteworthy that the locking part 221 of the present disclosure is integrally formed with and bent from the elastic positioning and locking plate 22, and the locking part 221 is a rectangular block structure protruding towards a surface of the rack 11, and the locking part 221 is provided with a first corner 2211 and a second corner 2212 at two corners of the other square hole 111 respectively, the first corner 2211 is configured to be corresponsive to the corner of the other square hole 111 that the locking part 221 enters the other square hole 111, and the second corner 2212 is configured to be corresponsive to the corner that the locking part 221 snaps to the other square hole 111, and the first corner 2211 has a curved round corner with a radius greater than the radius of the curved round corner of the second corner 2212, such that when the locking part 221 enters into the other square hole 111, the locking part 221 can be guided, installed, and snapped to the other square hole 111 securely. After actual verification, the locking part 221 has a width of 12.5 mm and a thickness of 2.5 mm.

The load-bearing part 23 is integrally formed with and bent from a lower edge of the main body 21, configured to be perpendicular to the main body 21, and extended in the extension direction of the main body 21, for carrying the server chassis 3.

Each of the reinforcement ribs 24 is integrally formed at a position of the main body 21 which is connected to the load-bearing part 23, the reinforcement ribs 24 is protruded from the main body 21 and a surface of the load-bearing part 22 and contacted with the server chassis 3 to reduce frictional resistance during the pulling of the server chassis. It is noteworthy that the reinforcement ribs 24 of the present disclosure are non-equidistantly spaced from each other, and the reinforcement ribs 24 are protruded from the main body 21 and a surface of the load-bearing part 23 with a height falling within a range of 0.05~0.15 mm, wherein actual verifications show that the most preferred height is 0.05 mm. In addition, the bracket 2 of the present disclosure is divided into three areas, respectively: a front section, a middle section and a rear section by the first hook 211 and the second hook 212 according to setting, and two of the reinforcement ribs 24 are arranged in the front section, three of the reinforcement ribs 24 are arranged in the middle section, and one of the reinforcement ribs 24 is arranged in the rear section, wherein the reinforcement ribs 24 in each area are uniformly distributed, and actual verifications show that each reinforcement rib 24 has a width of 10 mm, and the plurality of reinforcement ribs 24 that is arranged at the main body 21 has a length of 30 mm, and the plurality of reinforcement ribs 24 that is arranged at load-bearing part 23 has a length of 15 mm.

In addition, the bracket 2 of the present disclosure further includes a retainer 25, integrally formed with an end of the main body 21 and provided for stopping the server chassis 3 to prevent the server chassis 3 from falling backward.

In summation of the description above, during the installation of the bracket 2 of the present disclosure, the first hook 211 and the second hook 212 are approached from the horizontal direction of the rack 11 and attached onto its plane, and then the first hook 211 and the second hook 212 are passed into the two square holes 111 respectively, and the elastic positioning and locking plate 22 is used to lock the main body 21 into the open rack 1, or perform a release function. Each of the reinforcement ribs 24 is integrally formed with a surface of the main body 21 which is connected to the load-bearing part 23, so as to reduce frictional resistance when pushing in or pulling out the server chassis 3. Since the bracket 2 is integrally formed, the structure can be simplified greatly, the bracket 2 can be mounted into the open rack 1 quickly, and the server chassis 3 can be operated in a drawer-like operation quickly to improve the convenience of operation and the secured installation.

What is claimed is:

1. A pair of brackets for an open rack, wherein four corners inside the open rack are provided with a rack separately, each of the racks comprises a plurality of square holes provided for mounting the pair of brackets between two racks that across the same side of the open rack, such that a server chassis is capable of putting into the open rack or being taken out from the open rack in a drawer-like operation through the pair of brackets, each of the pair of brackets comprising:
   a main body, with a first hook disposed on a front side thereof and configured to be corresponsive to one of the racks, a second hook disposed on a rear side of the main body and configured to be corresponsive to another one of the racks, openings of the first hook and the second hook being horizontally configured, and adjacent a side of the first hook being provided with an operating hole in the main body;
   an elastic positioning and locking plate, coupled into the operating hole, and comprising a locking part protruded from the elastic positioning and locking plate and configured to be corresponsive to the first hook, such that after the first hook is embedded into a square hole, the locking part is locked into another square hole that is lower to form a locking status, and the elastic positioning and locking plate further comprising an operating part configured to be corresponsive to the operating hole and operated to separate the locking part from the other square hole to define a release status;
   a load-bearing part, integrally formed with and bent from a lower edge of the main body, configured to be perpendicular to the main body, and extended along an extension direction of the main body, for carrying the server chassis; and
   a plurality of reinforcement ribs, integrally formed with a position of the main body coupled to the load-bearing part, protruded from the main body and a surface of the load-bearing part, and contacted with the server chassis to reduce a frictional resistance produced during pulling of the server chassis,
   wherein the locking part is integrally formed with and bent from the elastic positioning and locking plate, and the locking part is a rectangular block structure protruding towards a surface of the rack to which the respective first hook is attached.

2. The pair of brackets according to claim 1, wherein the locking part comprises a first corner and a second corner configured to be corresponsive to two corners of the other square hole respectively, the first corner is configured to be corresponsive to a corner position of the other square hole that the locking part enters into the other square hole, and the second corner is configured to be corresponsive to a corner position of the other square hole that the locking part snaps to the other square hole.

3. The pair of brackets according to claim 2, wherein the first corner has a curved round corner with a radius greater than a radius of a curved round corner of the second corner, such that the locking part is guided, installed, and snapped securely into the other square hole when entering into the other square hole.

4. The pair of brackets according to claim 3, wherein the locking part has a width of 12.5 mm and a thickness of 2.5 mm.

5. The pair of brackets according to claim 1, wherein the plurality of reinforcement ribs is non-equidistantly spaced from each other, and a height of the plurality of reinforcement ribs protruded from the main body and the surface of the load-bearing part falls within a range of 0.05~0.15 mm.

6. The pair of brackets according to claim 5, wherein each of the pair of brackets is divided into three areas, respectively: a front section, a middle section, and a rear section by the first hook and the second hook, and two of the plurality of reinforcement ribs are arranged in the front section, three of the plurality of reinforcement ribs are arranged in the middle section, and one of the plurality of reinforcement ribs is arranged in the rear section, and the plurality of reinforcement ribs in each area are uniformly distributed.

7. The pair of brackets according to claim 6, wherein each of the plurality of reinforcement ribs has a width of 10 mm, and the plurality of reinforcement ribs that is arranged at the main body has a length of 30 mm, and the plurality of reinforcement ribs that is arranged at load-bearing part has a length of 15 mm.

8. The pair of brackets according to claim 1, further comprising a retainer integrally formed with an end of the main body and provided for blocking the server chassis to prevent the server chassis from falling backward.

* * * * *